(12) United States Patent
Ye

(10) Patent No.: US 10,719,151 B2
(45) Date of Patent: Jul. 21, 2020

(54) DISPLAY SCREEN AND MANUFACTURING METHOD THEREOF

(71) Applicant: Wuhan China Star Optoelectronics Semiconductor Display Technology Co., Ltd., Wuhan (CN)

(72) Inventor: Jian Ye, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 50 days.

(21) Appl. No.: 15/756,307

(22) PCT Filed: Oct. 20, 2017

(86) PCT No.: PCT/CN2017/107140
§ 371 (c)(1),
(2) Date: Oct. 23, 2018

(87) PCT Pub. No.: WO2019/037224
PCT Pub. Date: Feb. 28, 2019

(65) Prior Publication Data
US 2019/0056829 A1  Feb. 21, 2019

(30) Foreign Application Priority Data
Aug. 21, 2017 (CN) .......................... 2017 1 0723022

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *H01L 27/124* (2013.01);
(Continued)

(58) Field of Classification Search
CPC ... G06F 3/0412; G06F 3/044; H01L 27/1218; H01L 27/124; H01L 27/1248;
(Continued)

(56) References Cited

U.S. PATENT DOCUMENTS

| 2014/0225838 A1* | 8/2014 | Gupta | .................... G06F 3/0412 345/173 |
| 2016/0378233 A1* | 12/2016 | Huo | ....................... G06F 3/0412 345/174 |

(Continued)

FOREIGN PATENT DOCUMENTS

| CN | 103928492 A | 7/2014 |
| CN | 104978066 A | 10/2015 |

(Continued)

*Primary Examiner* — Alexander Eisen
*Assistant Examiner* — Cory A Almeida
(74) *Attorney, Agent, or Firm* — Brinks Gilson & Lione

(57) ABSTRACT

The present disclosure discloses a display screen and a manufacturing method thereof. The display screen includes: a TFT (thin film transistor) array substrate; a first planarization layer deposited on the TFT array substrate; a combining-structure layer deposited on the first planarization layer, the combining-structure layer includes a layer of first touch electrodes, a second planarization layer, and a layer of anode electrodes, the layer of the first touch electrodes and the layer of the anode electrodes are two different layers; an organic light emitting layer deposited on the combining-structure layer; a patterned cathode layer deposited on the organic light emitting layer includes a number of cathode electrodes used as second touch electrodes; and an encapsulation layer formed on the patterned cathode layer.

13 Claims, 5 Drawing Sheets

(51) Int. Cl.
*H01L 27/12* (2006.01)
*H01L 51/50* (2006.01)
*H01L 51/52* (2006.01)
*H01L 51/56* (2006.01)
*G06F 3/044* (2006.01)
*H01L 51/00* (2006.01)

(52) U.S. Cl.
CPC ...... *H01L 27/1218* (2013.01); *H01L 27/1248* (2013.01); *H01L 27/1259* (2013.01); *H01L 27/323* (2013.01); *H01L 27/3246* (2013.01); *H01L 51/5012* (2013.01); *H01L 51/5206* (2013.01); *H01L 51/5209* (2013.01); *H01L 51/5221* (2013.01); *H01L 51/56* (2013.01); *G06F 2203/04103* (2013.01); *H01L 27/3258* (2013.01); *H01L 51/0097* (2013.01); *H01L 51/5237* (2013.01)

(58) Field of Classification Search
CPC ............... H01L 27/1259; H01L 27/323; H01L 27/3246; H01L 27/3258; H01L 51/5012; H01L 51/5206; H01L 51/5209; H01L 51/5221; H01L 51/56; H01L 51/0097; H01L 51/5237
See application file for complete search history.

(56) References Cited

U.S. PATENT DOCUMENTS

| 2017/0220150 A1 | 8/2017 | Wu |
| 2018/0088725 A1 | 3/2018 | Yang et al. |

FOREIGN PATENT DOCUMENTS

| CN | 205353991 U | 6/2016 |
| CN | 106098742 A | 11/2016 |
| CN | 106654067 A | 5/2017 |
| CN | 106775062 A | 5/2017 |
| CN | 106887450 A | 6/2017 |
| CN | 107024796 A | 8/2017 |
| KR | 1020150029903 A | 3/2015 |

* cited by examiner

DISPLAY SCREEN AND MANUFACTURING METHOD THEREOF

CROSS-REFERENCE TO RELATED APPLICATIONS

The present application is a 35 U.S.C. 071 National Phase conversion of International (PCT) Patent Application No. PCT/CN2017/107140 filed Oct. 20, 2017, which claims foreign priority to Chinese Patent Application No. 201710723022.4, filed on Aug. 21, 2017 in the State Intellectual Property Office of China, the entire contents of which are hereby incorporated by reference.

TECHNICAL FIELD

Embodiments of the present disclosure generally relate to display technology, and in particular relate to a display screen and producing method thereof.

BACKGROUND

With the rapid development of flexible display OLED technology, which requires that the touch screen with the same also need to have the characteristics of flexibility and foldable, while the conventional touch screen which is based on ITO material has been unable to meet the requirements of flexible touch.

Due to the limitation of the inherent structure of an OLED itself and the complexity of the production process, the touch screen with the same usually needs to be produced separately, and then be adhered on the OLED through an optical transparent glue to form a complete touch display module, and the overall thickness is increased, which is not beneficial for flexing and the bonding process is added at the same time, and is not beneficial for the overall lightness of the flexible touch screen display

SUMMARY

The present disclosure provides a display screen and a producing method thereof, which can reduce the overall thickness of a display screen and is beneficial for realizing the characteristics of flexibility and foldable.

In order to resolve the above-mentioned technical problem, a technical scheme adopted by the present disclosure is: providing a method for manufacturing a display screen, including: providing a TFT (thin film transistor) array substrate; forming a first planarization layer on the TFT array substrate; forming a combining-structure layer on the first planarization layer, the combining-structure layer including a layer of first touch electrodes and a layer of anode electrodes, the layer of the first touch electrodes and the layer of the anode electrodes being disposed at different layers, and each of the first touch electrodes being arranged between two adjacent anode electrodes, the steps of forming the combining-structure layer including: depositing the layer of anode electrodes on the first planarization layer, the first planarization layer defining a plurality of first holes; depositing a second planarization layer on the first planarization layer, the second planarization layer defining a plurality of second holes corresponding to the first holes, the anode electrodes being connected with drain electrodes of the TFT array substrate via the first holes and the second holes; and forming the layer of the first touch electrodes on the second planarization layer; forming an organic light emitting layer and a patterned cathode layer successively on the combining-structure layer, wherein the patterned cathode layer comprises a plurality of cathode electrodes used as second touch electrodes; and encapsulating to form the display screen, in which the layer of the anode electrodes are made of titanium oxide or silver, and the layer of the first touch electrodes are made of a material selected from a group consisting of silver, titanium, aluminum and molybdenum.

In order to resolve the above-mentioned technical problem, another technical scheme adopted by the present disclosure is: providing a display screen, including: a TFT (thin film transistor)array substrate; a first planarization layer deposited on the TFT array substrate; a combining-structure layer deposited on the first planarization layer, the combining-structure layer including a layer of first touch electrodes and a layer of anode electrodes, the layer of the first touch electrodes and the layer of the anode electrodes being disposed at different layers or disposed at a same layer, and each of the first touch electrodes being arranged between two adjacent anode electrodes; an organic light emitting layer deposited on the combining-structure layer; a patterned cathode layer deposited on the organic light emitting layer comprises a plurality of cathode electrodes used as second touch electrodes; and an encapsulation layer formed on the layer of the cathode electrodes.

In order to resolve the above-mentioned technical problem, another technical scheme adopted by the present disclosure is: providing a method for producing a display screen, including: providing a TFT (thin film transistor) array substrate; forming a first planarization layer on the TFT array substrate; forming a combining-structure layer on the first planarization layer, the combining-structure layer including a layer of first touch electrodes and a layer of anode electrodes, the layer of the first touch electrodes and the layer of the anode electrodes being disposed at different layers or disposed at a same layer, and each of the first touch electrodes being arranged between two adjacent anode electrodes; forming an organic light emitting layer and a patterned cathode layer successively on the combining-structure layer, wherein the patterned cathode layer comprises a plurality of cathode electrodes used as second touch electrodes; and encapsulating to form the display screen.

The present disclosure has the advantages that a display screen and producing method thereof are provided, which integrates the layer of the first touch electrodes inside the display screen and on different layers or the same layer as the layer of the anode electrodes and takes the cathode layer comprises a plurality of cathode electrodes used as the second touch electrodes, which is capable of reducing the overall thickness of the display screen, and is beneficial for realizing the characteristics of flexibility and foldable.

DETAILED DESCRIPTION

The technical schemes in the embodiments of the present disclosure will now be described in conjunction with the accompanying drawings in the embodiments of the present disclosure, and it will be apparent that the described embodiments are merely part of the embodiments of the disclosure, and are not all embodiments. All other embodiments obtained based on the embodiments in the present disclosure by those of ordinary skill in the art without making creative work are within the scope of the present disclosure.

Figure 1:
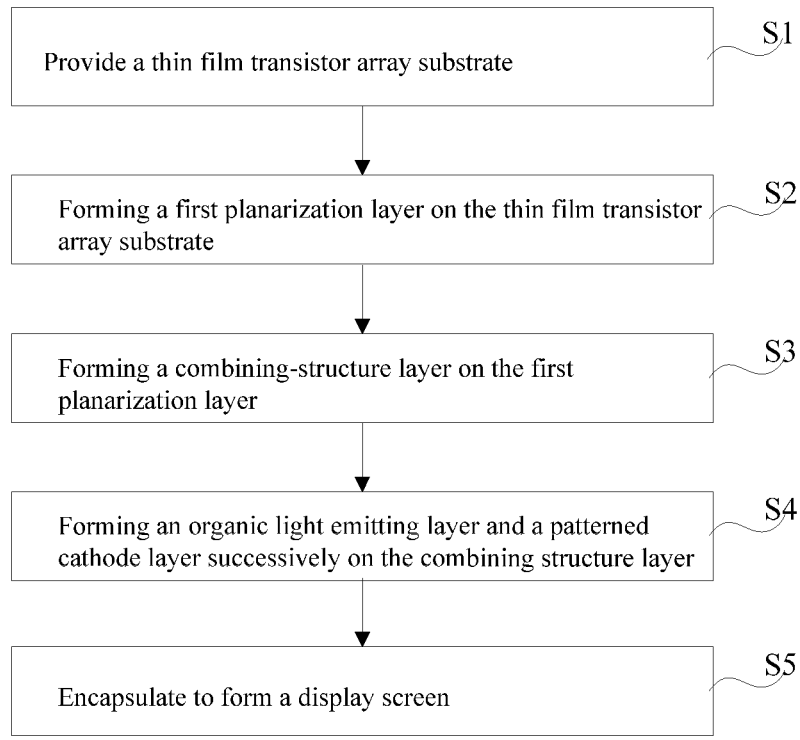
FIG. 1 is a flow chart of a manufacturing method for a display screen according to an embodiment of the present disclosure.

Referring to FIG. 1, it is a flow chart of a manufacturing method for a display screen according to an embodiment of the present disclosure. The method may include:

S1: providing a TFT (thin film transistor) array substrate.

In this step, an array substrate is provided firstly. The array substrate may be made of a transparent material, such as, a glass substrate, a ceramic substrate, or a transparent plastic substrate, etc., which is not limited herein. In this embodiment, the array substrate is a glass substrate.

Furthermore, thin film transistors (TFTs) are formed on the array substrate, which may specifically include the following steps:
depositing a buffer layer, a semiconductor layer, a gate insulation layer, a gate layer, an interlayer dielectric layer, and a layer of source drain electrodes successively on the above-mentioned array substrate, in which its (i.e., thin film transistors) manufacturing method and process are well-known for those skilled in the art, and may refer to the conventional method and process for manufacturing the thin film transistors, which are not limited herein. Therefore, in the disclosure, the TFT array substrate is a substrate with the TFTs formed thereon.

S2: forming a first planarization layer on the TFT array substrate.

The first planarization layer is formed on the above-mentioned TFT array substrate, and the first planarization layer may be made of an organic photoresist material. Furthermore, the first planarization layer may define a plurality of first holes corresponding to the drain electrodes in the above-mentioned TFTs.

S3: forming a combining-structure layer on the first planarization layer.

In which, the combining-structure layer specifically includes a layer of first touch electrodes, a second planarization layer, and a layer of anode electrodes. In addition, there are two cases corresponding to whether the layer of the first touch electrodes and the layer of the anode electrodes are on a same layer or not.

1. The layer of the first touch electrodes and the layer of the anode electrodes are two different layers.

Figure 2:
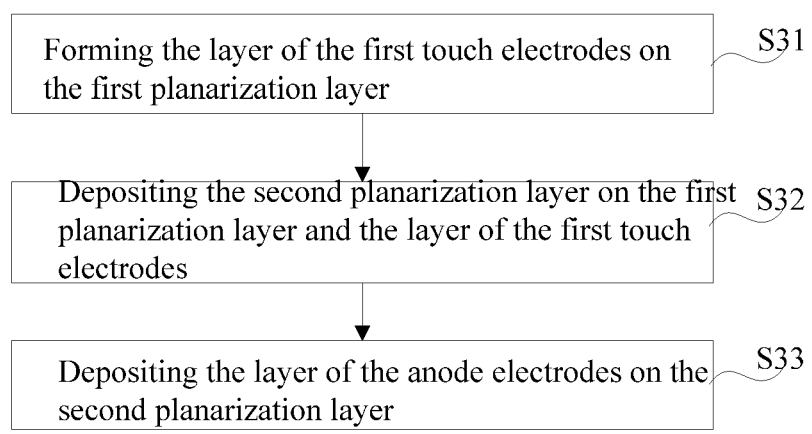
FIG. 2 is a flow chart of a first embodiment of step S3 in FIG. 1 of the present disclosure.

If the layer of the first touch electrodes and the layer of the anode electrodes are two different layers, and each of the first touch electrodes is arranged between two adjacent anode electrodes, the manufacturing process is also divided into the following two cases.

a) Referring to FIG. 2, the S3 may include the following blocks.

S31, forming the layer of the first touch electrodes on the first planarization layer.

In which, the first touch electrodes may be driving electrodes TX or inductive electrodes RX.

Figure 3:
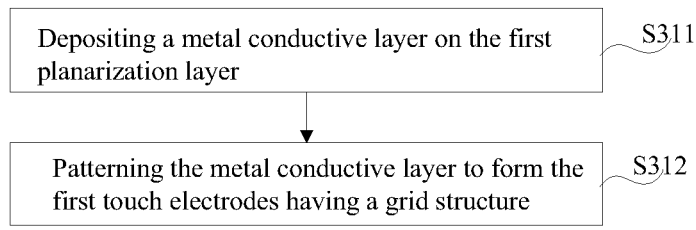
FIG. 3 is a flow chart of an embodiment of step S31 in FIG. 2 of the present disclosure.

Referring to FIG. 3, the S31 may include the following blocks.

S311, depositing a metal conductive layer on the first planarization layer.

In block S311, the deposition method of the metal conductive layer includes, but is not limited to, for example, physical deposition or chemical vapor deposition, which is not limited herein. In the present disclosure, the metal conductive layer is formed on the first planarization layer through physical deposition, and the material of the metal conductive layer may be selected from a group consisted of silver, titanium, aluminum and molybdenum.

S312, patterning the metal conductive layer to form the first touch electrodes having the grid structure.

Figure 4:
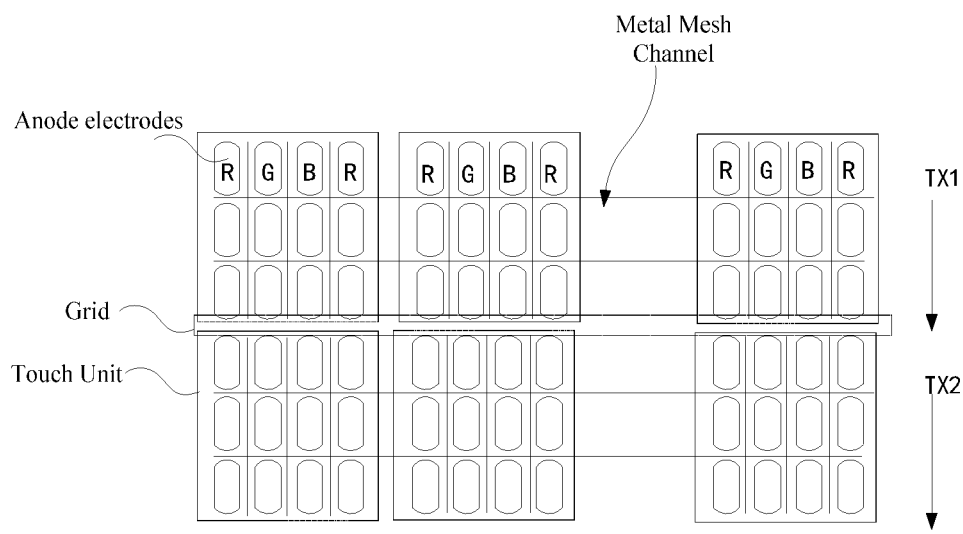
FIG. 4 is a schematic diagram of an embodiment of a layer of the first touch electrodes of the present disclosure.

The metal conductive layer is exposed, developed and etched to form the first touch electrodes having the grid structure through a mask preset with specific patterns. In which, the traces of the grid structure of the layer of the first touch electrodes are designed to avoid a light emitting pixel electrodes region, that is, the anode electrodes region, and the grid-structured conductive layer forms the strip-like first touch electrodes which are staggered and are connected to each other to form horizontal or longitudinal continuous conduction. Referring to FIG. 4, a schematic diagram of an embodiment of a layer of the first touch electrodes of the present disclosure. Specifically, the shape of the layer of the first touch electrodes may be a plurality of diamond-shaped patterns connected together to form a layer of continuously conductive strip-like electrodes or the units of other shapes connected with each other to form a layer of conductive strip-like electrodes, which is not limited herein.

S32, depositing the second planarization layer on the first planarization layer and the layer of the first touch electrodes.

In which, the second planarization layer may be made of an organic photoresist material. Furthermore, the second planarization layer may define a plurality of second holes in the second planarization layer corresponding to the first holes in the first planarization layer.

S33, depositing the layer of the anode electrodes on the second planarization layer.

Figure 5:
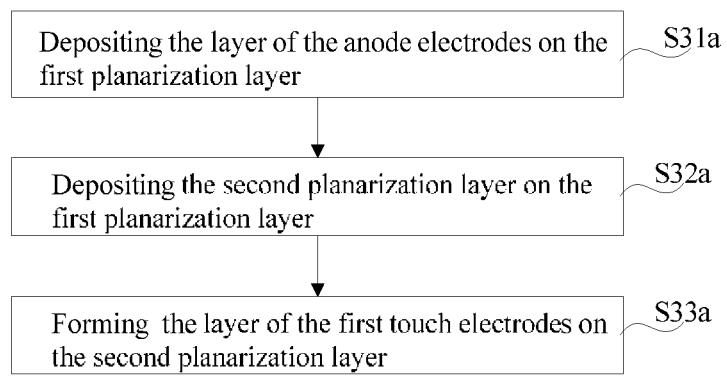
FIG. 5 is a flow chart of a second embodiment of step S3 in FIG. 1 of the present disclosure.

A layer of pixel electrodes, that is, the layer of the anode electrodes, may be deposited on the second planarization layer, and the material of the layer of the anode electrodes include, but is not limited to, titanium oxide and silver. In which, the anode electrodes are connected with the drain electrodes of the TFTs via the first holes on the first planarization layer and the second holes on the second planarization layer respectively. In addition, in this embodiment, each of the first touch electrodes is arranged between two adjacent anode electrodes.

b) Referring to FIG. 5, the S3 may further include the following blocks:

The difference between the manufacturing flow of the combining-structure layer in this embodiment and the manufacturing flow of the combining-structure layer in FIG. 2 is that the combining-structure layer in FIG. 2 is manufactured by forming the layer of the first touch electrodes, the second planarization layer, and the layer of the anode electrodes successively on the first planarization layer, while the combining-structure layer in this embodiment is manufactured by forming the layer of the anode electrodes, the second planarization layer, and the layer of the first touch electrodes successively on the first planarization layer, and the specifically blocks are the follows:

S31a, depositing the layer of the anode electrodes on the first planarization layer.

A layer of pixel electrodes, that is, the layer of the anode electrodes, is deposited on the first planarization layer, and the material of the layer of the anode electrodes may include, but is not limited to, titanium oxide and silver. In which, the anode electrodes are connected with the drain electrodes of the TFTs via the first holes on the first planarization layer.

S32a, depositing the second planarization layer on the first planarization layer.

Then, the second planarization layer is formed on the first planarization layer, in which the second planarization layer may be made of an organic photoresist material. Furthermore, the second planarization layer may define a plurality of second holes in the second planarization layer corresponding to the first holes in the first planarization layer, and the second holes made the layer of the anode electrodes to be exposed.

S33a, forming the layer of the first touch electrodes on the second planarization layer.

In which, the first touch electrodes may be driving electrodes TX or inductive electrodes RX.

Figure 6:
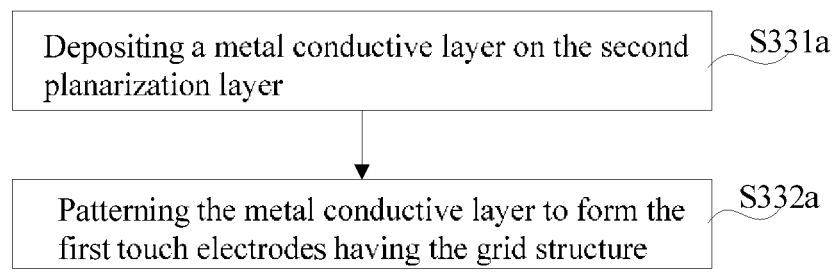
FIG. 6 is a flow chart of an embodiment of step S33a in FIG. 5 of the present disclosure.

Referring to FIG. 6, the S33a may further include the following blocks.

S33a, depositing a metal conductive layer on the second planarization layer.

In block S311a, the deposition method of the metal conductive layer includes, but is not limited to, for example, physical deposition or chemical vapor deposition, which is not limited herein. In the present disclosure, the metal conductive layer is formed on the second planarization layer through physical deposition, and the material of the metal conductive layer may be selected from a group consisted of silver, titanium, aluminum and molybdenum.

S332a, patterning the metal conductive layer to form the first touch electrodes having the grid structure.

The metal conductive layer is exposed, developed and etched to form the first touch electrodes having the grid structure through a mask preset with specific patterns. In which, the traces of the grid structure of the layer of the first touch electrodes are designed to avoid a light emitting pixel electrodes region, that is, the anode electrodes region, and the grid-structured conductive layer forms the strip-like layer of the first touch electrodes which are staggered and are connected to each other to form horizontal or longitudinal continuous conduction. Specifically, the shape of the layer of the first touch electrodes may be a plurality of diamond-shaped patterns connected together to form a layer of continuously conductive strip-like electrodes or the units of other shapes connected with each other to form a layer of conductive strip-like electrodes, which is not limited herein.

2. The layer of the first touch electrodes and the layer of the anode electrodes are a same layer.

Figure 7:
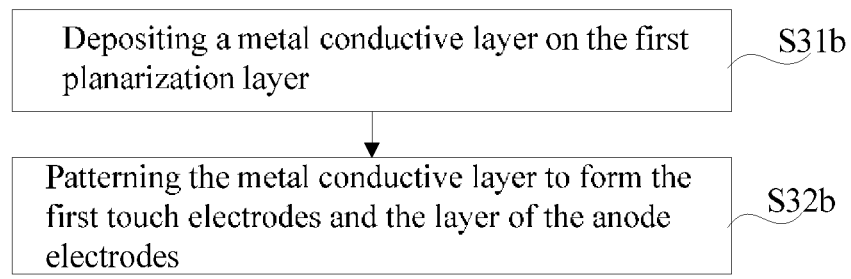
FIG. 7 is a flow chart of a third embodiment of steps S3 in FIG. 1 of the present disclosure.

Referring to FIG. 7, Step S3 may include the following blocks.

S31b, depositing a metal conductive layer on the first planarization layer.

The metal conductive layer is deposited on the entire surface of the first planarization layer, the deposition method of the metal conductive layer includes, but is not limited to, for example, physical deposition or chemical vapor deposition, which is not limited herein. In the present disclosure, the metal conductive layer is deposited on the first planarization layer through physical deposition, and the material of the metal conductive layer may be selected from a group consisted of silver, titanium, aluminum and molybdenum.

S32b, patterning the metal conductive layer to form the first touch electrodes and the layer of the anode electrodes.

In this embodiment, a mask preset with specific patterns is adopted to expose, develop, and etch the metal conductive layer to simultaneously form the anode electrodes and the first touch electrodes having the grid structure (driving electrodes or inductive electrodes), each of which may be arranged between two adjacent anode electrodes. The first touch electrodes and the anode electrodes are independent and insulated from each other, and the grid-shaped conductive layer forms the strip-like layer of the first touch electrodes which are staggered and are connected to each other to form horizontal or longitudinal continuous conduction. In which the pattern of the grid-structured metal conductive electrode is not limited, which can be, for example, a plurality of diamond-shaped patterns connected together to form a layer of continuously conductive strip-like electrodes, or the units of other shapes connected with each other to form a layer of conductive strip-like electrodes.

S4: forming an organic light emitting layer and a patterned cathode layer successively on the combining-structure layer.

In which, the organic light emitting layer may specifically include a pixel definition layer and a layer of the OLED pixel structures, and the manufacturing method thereof may include, but is not limited to, vapor deposition or ink jet printing, which is not further limited herein.

Furthermore, a metal cathode layer is deposited on the entire surface of the above-mentioned organic light emitting layer, and the metal cathode layer is formed in a manner similar to the above-mentioned method of manufacturing the first touch electrodes and the anode electrodes, that is, a mask preset with specific patterns is adopted, and the cathode layer is patterned through exposing, developing and etching to form a strip-like layer of second touch electrodes which comprises a plurality of cathode electrodes, and the cathode electrodes may be inductive electrodes or driving electrodes. That is to say, if the above-mentioned first touch electrodes are driving electrodes, the second touch electrodes, that is, the cathode electrodes are inductive electrodes; and if the above-mentioned first touch electrodes are inductive electrodes, the cathode electrodes are driving electrodes. Which is applicable to the cases corresponding to whether the layer of the anode electrodes and the layer of the first touch electrodes are a same layer or not, and will not be described again herein.

S5: encapsulating to form a display screen.

An encapsulation layer is formed on the patterned cathode layer, so as to protect an OLED display from the affect of its ambient environmental moisture and oxygen which will reduce its life cycle. In addition, its encapsulation method is well-known for those skilled in the art, and may refer to the conventional OLED display encapsulation technology, which is not further limited herein.

In the above-mentioned embodiment, the layer of the first touch electrodes of the display screen is integrated into the inside of the display screen, and the cathode electrodes are taken as the second touch electrodes and are located on a same layer/two different layers with the anode electrodes, which is capable of omitting the process of separately making the touch film and reducing the overall thickness of the display screen.

Figure 8:
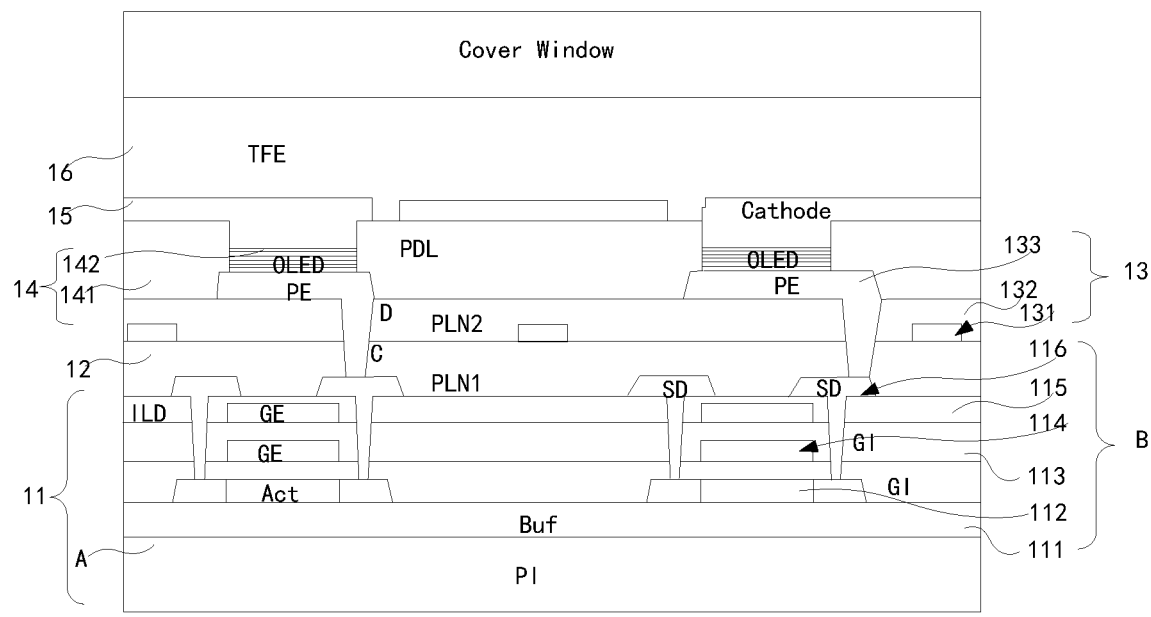
FIG. 8 is a schematic diagram of a first embodiment of a display screen of the present disclosure.

Referring to FIG. 8, it is a schematic diagram of a first embodiment of a display screen of the present disclosure. As shown in FIG. 8, the display screen 10 includes a TFT array substrate 11, a first planarization layer 12, a combining-structure layer 13, an organic light emitting layer 14, a layer of cathode electrodes 15, and an encapsulation layer 16.

In which, the TFT (thin film transistor) array substrate 11 further includes an array substrate A and TFTs B. The array substrate A may be made of a transparent material, and may be any substrate such as a glass substrate, a ceramic substrate, or a transparent plastic substrate. The TFTs B may further include a buffer layer 111, a semiconductor layer 112, a gate insulating layer 113, a gate layer 114, an interlayer dielectric layer 115, and a layer of source drain electrodes 116.

The first planarization layer 12 is deposited on the above-mentioned TFT array substrate 11. The first planarization layer 12 may be made of an organic photoresist material, and the first planarization layer 12 may define a plurality of first holes C on the first planarization layer 12 corresponding to the drain electrodes 116 in the TFTs B.

In this embodiment, the combining-structure layer 13 further includes a layer of first touch electrodes 131, a second planarization layer 132, and a layer of anode electrodes 133 successively deposited on the first planarization layer 12.

In which, the first touch electrodes 131 may be driving electrodes TX or inductive electrodes RX, and the material of the first touch electrodes 131 may be selected from a group consisted of silver, titanium, aluminum and molybdenum. The second planarization layer 132 may be made of an organic photoresist material, and the second planarization layer 132 may define a plurality of second holes D on the second planarization layer 132 corresponding to the first holes C of the first planarization layer 12. The material of the anode electrodes 133 may include, but is not limited to, titanium oxide and silver. In which, the anode electrodes 133 are connected with the drain electrodes 116 in the TFTs B via the first holes C on the first planarization layer 12 and the second holes D on the second planarization layer 132. Furthermore, this embodiment is in accordance with the case that the layer of the first touch electrodes and the layer of the anode electrodes are two different layers, and each of the first touch electrodes is arranged between two adjacent anode electrodes.

The organic light emitting layer 14 may include a pixel definition layer 141 and an OLED pixel layer 142.

The patterned cathode layer 15 is deposited on the organic light emitting layer 14. The patterned cathode layer 15 is patterned to form stripe-like second touch electrodes, and the cathode electrodes 15 may be inductive electrodes or driving electrodes. That is to say, if the first touch electrodes 131 are driving electrodes, the cathode electrodes 15 are inductive electrodes, and if the first touch electrodes 131 are inductive electrodes, the cathode electrodes 15 are driving electrodes. Which is applicable to the cases corresponding to whether the layer of the anode electrodes and the layer of the first touch electrodes are a same layer or not, and will not be described again in the following embodiment.

The encapsulation layer 16 is formed on the layer of the cathode electrodes 15 to protect an OLED display from the affect of its ambient environmental moisture and oxygen which will reduce its life cycle.

In the above-mentioned embodiment, the layer of the first touch electrodes of the display screen is integrated into the inside of the display screen and is located on different layers with the layer of anode electrodes, and the cathode electrodes are taken as second touch electrodes, which is capable of reducing the overall thickness of the display screen, and is beneficial for realizing the characteristics of flexibility and foldable.

Figure 9:
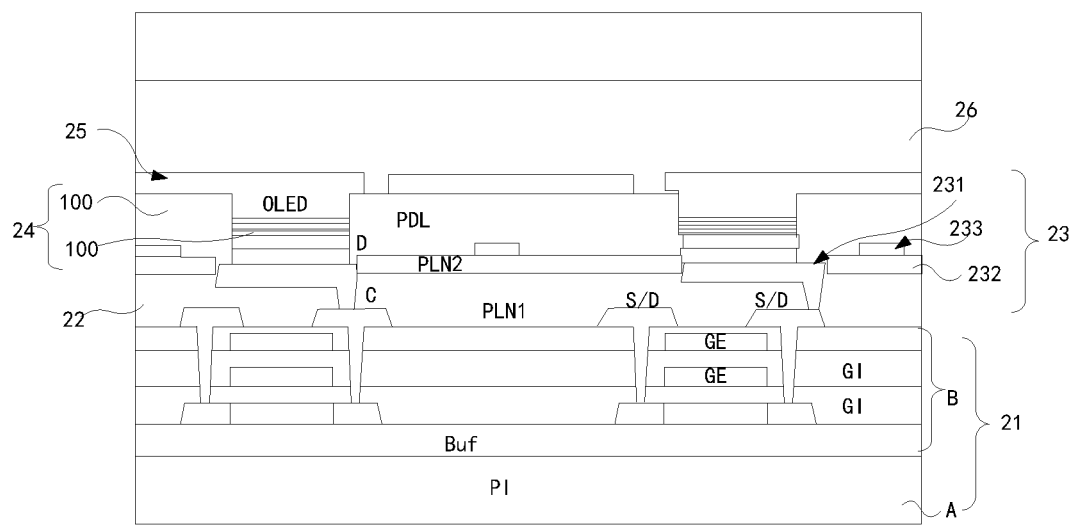
FIG. 9 is a schematic diagram of a second embodiment of a display screen of the present disclosure.

Referring to FIG. 9, it is a schematic diagram of a second embodiment of a display screen of the present disclosure. In this embodiment, the structure is substantially the same as the structure of the first embodiment of the display screen in FIG. 8, except that the combining-structure layer in FIG. 8 differs from the combining-structure layer in this embodiment, which will be described as follows.

In this embodiment, a display screen 20 includes a TFT array substrate 21, a first planarization layer 22, a combining-structure layer 23, an organic light emitting layer 24, a layer of cathode electrodes 25, and an encapsulation layer 26.

In which, the combining-structure layer 23 further includes a layer of anode electrodes 231, a second planarization layer 232, and a layer of first touch electrodes 233 successively deposited on the first planarization layer 22. This embodiment is in accordance with the case that the layer of the first touch electrodes and the layer of the anode electrodes are two different layers and each of the first touch electrodes is arranged between two adjacent anode electrodes. The remaining structures may refer to the structures in FIG. 8, and will not be described again herein.

In the above-mentioned embodiment, the layer of the first touch electrodes of the display screen is integrated into the inside of the display screen and is located on different layers with the layer of the anode electrodes, and the cathode electrodes are taken as second touch electrodes, which is capable of reducing the overall thickness of the display screen, and is beneficial for realizing the characteristics of flexibility and foldable.

Figure 10:
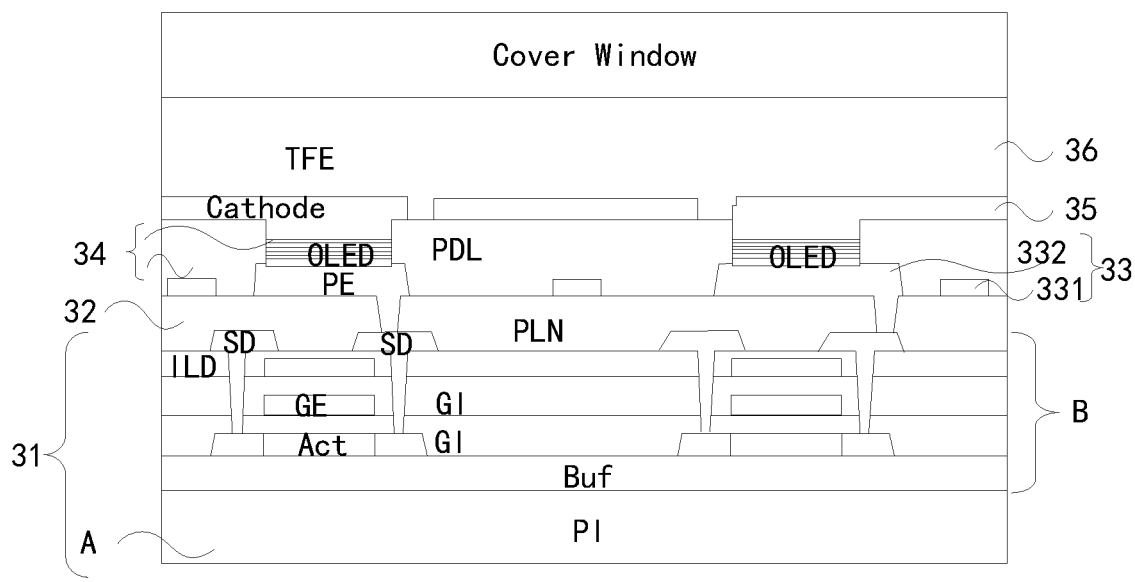
FIG. 10 is a schematic diagram of a third embodiment of a display screen of the present disclosure.

Referring to FIG. 10, it is a schematic diagram of a third embodiment of a display screen of the present disclosure. This embodiment differs from the display screen in FIGS. 8 and 9 in that, in this embodiment, the layer of the anode electrodes and the layer of the first touch electrodes are located on a same layer, which will be described as follows.

In this embodiment, a display screen 30 includes a TFT (thin film transistor) array substrate 31, a first planarization layer 32, a combining-structure layer 33, an organic light emitting layer 34, a layer of cathode electrodes 35, and an encapsulation layer 36.

In which, the combining-structure layer 33 includes a layer of first touch electrodes 331 and a layer of anode electrodes 332 deposited on the first planarization layer 32. In which, the layer of the anode electrodes 332 and the layer of the first touch electrodes 331 are located on a same layer. The description of the rest structures may refer to the description of the specific structure of the display screen in FIG. 7, and will not be described again herein.

In the above-mentioned embodiment, the layer of the first touch electrodes is integrated into the inside of the display screen and is located on a same layer with the layer of the anode electrodes, and the cathode electrodes are taken as second touch electrodes, which is capable of reducing the overall thickness of the display screen, and is beneficial for realizing the characteristic of flexibility and foldable.

Furthermore, in each of the embodiments in FIGS. 8 to 10, the manufacturing method or principle of all the structures are described in detail in the above-mentioned production methods, and will not be described again herein.

In the above-mentioned embodiment, the layer of the first touch electrodes is integrated into the inside of the display screen and is located on a same layer/different layers with the layer of the anode electrodes, and the cathode electrodes are taken as second touch electrodes, which is capable of reducing the overall thickness of the display screen, and is beneficial for realizing the characteristics of flexibility and foldable.

In view of the foregoing, it will be easily understood by those skilled in the art that the present disclosure provides a display screen and a manufacturing method thereof, in which the layer of the first touch electrodes is integrated into the inside of the display screen and is located on different layers/the same layer with the layer of anode electrodes, and the cathode electrodes are taken as second touch electrodes, which is capable of reducing the overall thickness of the display screen, and is beneficial for realizing the characteristics of flexibility and foldable.

The foregoing is merely embodiments of the present disclosure, and is not intended to limit the scope of the present disclosure. Any equivalent structure or flow transformation made based on the specification and the accompanying drawings of the present disclosure, or any direct or indirect applications of the disclosure on other related fields, shall all be covered within the protection of the present disclosure.

What is claimed is:

1. A method for manufacturing a display screen, comprising:
   providing a TFT (thin film transistor) array substrate;
   forming a first planarization layer on the TFT array substrate;
   forming a combining-structure layer on the first planarization layer, wherein the combining-structure layer comprises a layer of first touch electrodes and a layer of anode electrodes, the layer of the first touch electrodes and the layer of the anode electrodes are two different layers, and each first touch electrode is arranged between two adjacent anode electrodes, and the steps of forming the combining-structure layer on the first planarization layer comprise:
   depositing the layer of the anode electrodes on the first planarization layer, and defining a plurality of first openings in the first planarization layer;
   depositing a second planarization layer on the first planarization layer, and defining a plurality of second openings in the second planarization layer corresponding to the first openings, the anode electrodes are connected to drain electrodes of the TFT array substrate via the first and the second openings respectively; and
   forming the layer of the first touch electrodes on the second planarization layer;
   forming an organic light emitting layer and a patterned cathode layer successively on the combining-structure layer, wherein the patterned cathode layer comprises a plurality of cathode electrodes as second touch electrodes; and
   encapsulating the TFT array substrate and all layers to form the display screen;
   wherein the layer of the anode electrodes is made of titanium oxide or silver, and the layer of the first touch electrodes is made of a material selected from a group consisting of silver, titanium, aluminum and molybdenum.

2. The method of claim 1, wherein the steps of forming the layer of the first touch electrodes on the second planarization layer, comprise:
   depositing a metal conductive layer on the second planarization layer;
   patterning the metal conductive layer to form the first touch electrodes.

3. The method of claim 2, wherein the steps of forming the first touch electrodes further comprise:
   exposing, developing and etching the metal conductive layer by a mask preset with specific patterns.

4. The method of claim 1, wherein the steps of forming the organic light emitting layer, comprise:
   forming a pixel definition layer and a layer of OLED pixel structures respectively.

5. A display screen, comprising:
   a TFT (thin film transistor) array substrate;
   a first planarization layer deposited on the TFT array substrate and defining a plurality of first openings;
   a combining-structure layer deposited on the first planarization layer, wherein the combining-structure layer comprises a layer of first touch electrodes, a layer of anode electrodes, and a second planarization layer, the layer of the first touch electrodes and the layer of the anode electrodes are two different layers, and each first touch electrode is arranged between two adjacent anode electrodes, the layer of the anode electrodes is disposed on the first planarization layer, the second planarization layer is disposed on the first planarization layer and defines a plurality of second openings corresponding to the first openings, the anode electrodes are connected to drain electrodes of the TFT array substrate via the first and the second openings respectively, and the layer of the first touch electrodes is formed on the second planarization layer;
   an organic light emitting layer deposited on the combining-structure layer;
   a patterned cathode layer deposited on the organic light emitting layer comprises a plurality of cathode electrodes as second touch electrodes; and
   an encapsulation layer formed on the patterned cathode layer to encapsulate the TFT array substrate and all layers to form the display screen;
   wherein the layer of the anode electrodes is made of titanium oxide or silver, and the layer of the first touch electrodes is made of a material selected from a group consisting of silver, titanium, aluminum and molybdenum.

6. A method for manufacturing a display screen, comprising:
   providing a TFT (thin film transistor) array substrate;
   forming a first planarization layer on the TFT array substrate;
   forming a combining-structure layer on the first planarization layer, wherein the combining-structure layer comprising a layer of first touch electrodes and a layer of anode electrodes, the layer of the first touch electrodes and the layer of the anode electrodes are two different layers, and each first touch electrode is arranged between two adjacent anode electrodes, and the steps of forming the combining-structure layer on the first planarization layer comprise:
   defining a plurality of first openings in the first planarization layer;
   depositing a second planarization layer on the first planarization layer, and defining a plurality of second openings in the second planarization layer corresponding to the first openings; and
   forming the layer of the first touch electrodes on the second planarization layer;
   forming an organic light emitting layer and a patterned cathode layer successively on the combining-structure layer, wherein the patterned cathode layer comprises a plurality of cathode electrodes as second touch electrodes; and encapsulating the TFT array substrate and all layers to form the display screen.

7. The method of claim 6, wherein the steps of forming the combining-structure layer on the first planarization layer further comprise:

depositing the layer of the anode electrodes on the second planarization layer, the anode electrodes are connected to drain electrodes of the TFT array substrate via the first and the second openings respectively.

8. The method of claim 7, wherein the steps of forming the layer of first touch electrodes on the first planarization layer, comprise:

depositing a metal conductive layer on the first planarization layer; and patterning the metal conductive layer to form the first touch electrodes.

9. The method of claim 8, wherein the steps of forming the first touch electrodes, comprise:

exposing, developing and etching the metal conductive layer by a mask preset with specific patterns.

10. The method of claim 6, wherein the layer of the anode electrodes is made of a material comprising titanium oxide or silver, and the layer of first touch electrodes is made of a material selected from a group consisting of silver, titanium, aluminum and molybdenum.

11. The display screen of claim 6, wherein the organic light emitting layer comprises:

a pixel definition layer and a layer of OLED pixel structures.

12. The method of claim 6, wherein the steps of forming the combining-structure layer on the first planarization layer, comprise:

depositing a metal conductive layer on the first planarization layer;

patterning the metal conductive layer to form the first touch electrodes and the layer of the anode electrodes.

13. The method of claim 12, wherein the steps of forming the first touch electrodes and the layer of the anode electrodes, comprise:

exposing, developing and etching the metal conductive layer by a mask preset with specific patterns to form the anode electrodes and the first touch electrodes arranged between two adjacent anode electrodes.

* * * * *